(12) United States Patent
Kim et al.

(10) Patent No.: US 8,796,671 B2
(45) Date of Patent: Aug. 5, 2014

(54) ORGANIC LIGHT EMITTING DIODE DISPLAY AND METHOD OF MANUFACTURING THE SAME

(75) Inventors: Soo-Hyun Kim, Cheonan-si (KR); Cheol-Ho Park, Busan (KR); Jong-Hyun Park, Yongin-si (KR); Sun Park, Hwaseong-si (KR); Chun-Gi You, Hwaseong-si (KR); Yul-Kyu Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 949 days.

(21) Appl. No.: 12/413,842

(22) Filed: Mar. 30, 2009

(65) Prior Publication Data

US 2010/0044685 A1    Feb. 25, 2010

(30) Foreign Application Priority Data

Aug. 22, 2008  (KR) ......................... 10-2008-0082399

(51) Int. Cl.
   *H01L 51/52*   (2006.01)

(52) U.S. Cl.
   USPC ................. 257/40; 257/72; 257/19; 438/99

(58) Field of Classification Search
   CPC ............ H01L 27/3272; H01L 27/3244; H01L 51/5284; H01L 51/3272
   See application file for complete search history.

(56) References Cited

U.S. PATENT DOCUMENTS

| | | | |
|---|---|---|---|
| 2003/0155860 A1* | 8/2003 | Choi et al. | 313/498 |
| 2005/0116292 A1* | 6/2005 | Koo et al. | 257/347 |
| 2006/0246979 A1* | 11/2006 | Chim et al. | 463/13 |
| 2007/0029548 A1* | 2/2007 | Yamazaki et al. | 257/40 |
| 2007/0291194 A1* | 12/2007 | Yoon | 349/43 |
| 2008/0038867 A1* | 2/2008 | Shin et al. | 438/99 |

FOREIGN PATENT DOCUMENTS

| | | |
|---|---|---|
| JP | 08-195495 | 7/1996 |
| JP | 2004-170705 | 6/2004 |
| JP | 2004-327539 | 11/2004 |
| JP | 2007-005384 | 1/2007 |

* cited by examiner

*Primary Examiner* — Robert Carpenter
(74) *Attorney, Agent, or Firm* — Cantor Colburn LLP

(57) ABSTRACT

An organic light emitting diode display including a substrate; a light blocking layer disposed on the substrate and having a semiconductor opening; a first semiconductor pattern disposed in the semiconductor opening; a gate insulating layer disposed on the light blocking layer and the first semiconductor pattern; a first gate electrode disposed on the gate insulating layer; a first source electrode electrically connected to the first semiconductor pattern; a first drain electrode spaced apart from the first source electrode; a protective insulating layer disposed on the first source electrode and the first drain electrode, the protective insulating layer having a contact portion; a pixel electrode disposed on the protective insulating layer contacting the first drain electrode through the contact portion; an emitting layer disposed on the pixel electrode; and a common electrode disposed on the emitting layer.

13 Claims, 11 Drawing Sheets

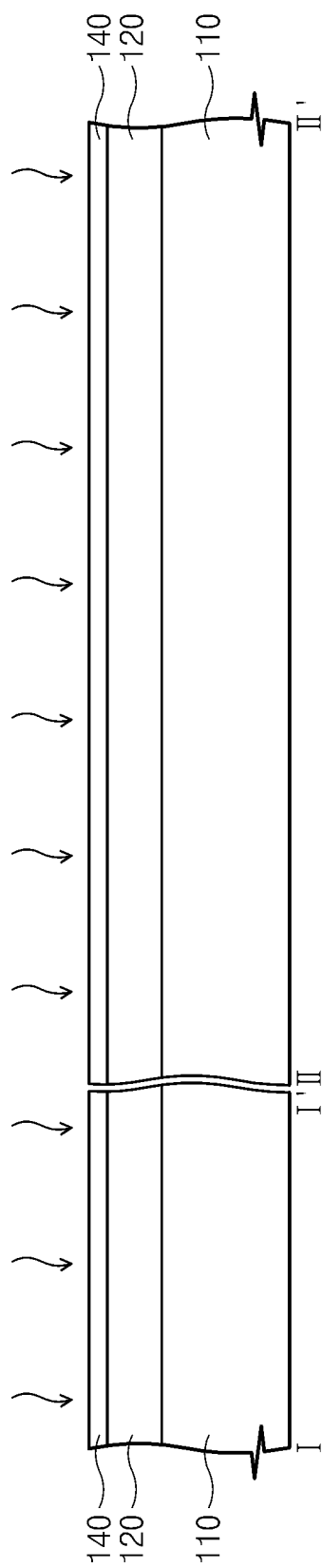
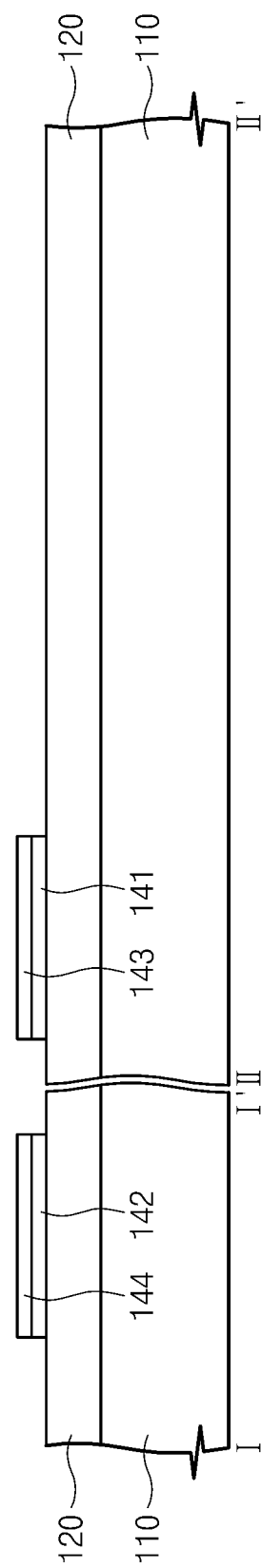

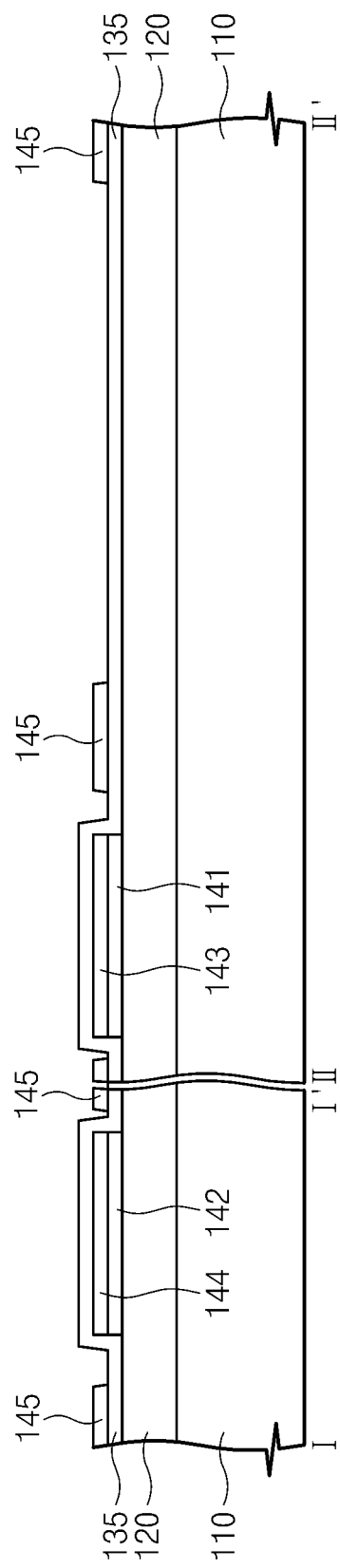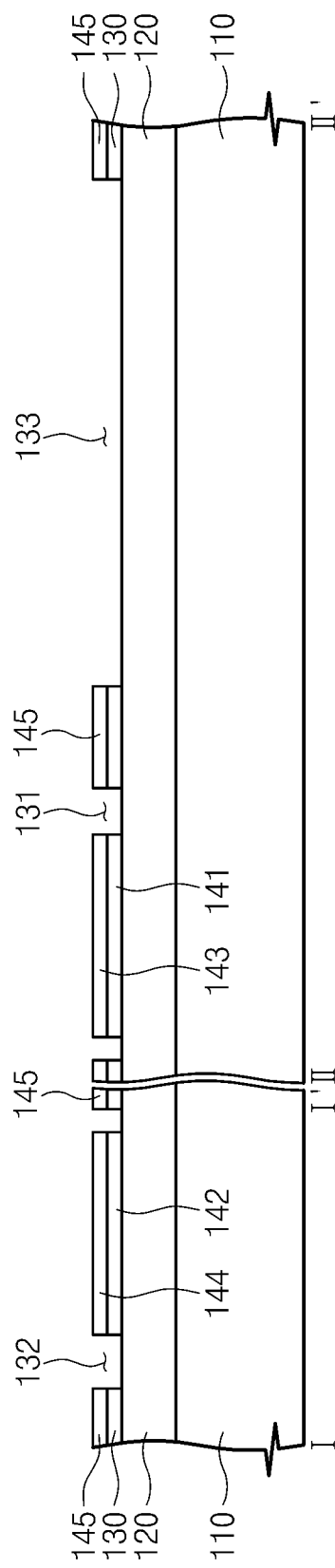

ORGANIC LIGHT EMITTING DIODE DISPLAY AND METHOD OF MANUFACTURING THE SAME

This application claims priority to Korean Patent Application No. 2008-82399, filed on Aug. 22, 2008, and all the benefits accruing therefrom under 35 U.S.C. §119, the contents of which in its entirety are herein incorporated by reference.

BACKGROUND OF THE INVENTION

1. Field of the Invention

This disclosure relates to an organic light emitting diode display and a method of manufacturing the same.

2. Description of the Related Art

It can be desirable for a display apparatus, such as a monitor or a television, to have a small size and a slim profile. In this regard, use of an organic light emitting diode ("OLED") display has been suggested.

The OLED display includes two electrodes and a light emitting layer interposed between the two electrodes. An electron injected from one electrode is combined with a hole injected from the other electrode at a light emitting layer to form an exciton that emits light while discharging energy. One of the electrodes can be connected with thin film transistors to control the light emitting layer.

In addition, a light blocking layer can be disposed below the thin film transistors to improve brightness. However, a defect may occur when a semiconductor of the thin film transistors crystallizes. While not wanting to be bound by theory, it has been suggested that crystallization of the thin film transistors can be due to the light blocking layer.

BRIEF SUMMARY OF THE INVENTION

Therefore, an exemplary embodiment provides an OLED display capable of preventing a crystallization defect, which can be caused by a light blocking layer.

Another exemplary embodiment provides a method of manufacturing the OLED display.

The above described and other drawbacks are alleviated by an organic light emitting diode display including a substrate; a light blocking layer disposed on the substrate and having a semiconductor opening; a first semiconductor pattern disposed in the semiconductor opening; a gate insulating layer disposed on the light blocking layer and the first semiconductor pattern; a first gate electrode disposed on the gate insulating layer; a first source electrode electrically connected to the first semiconductor pattern; a first drain electrode spaced apart from the first source electrode; a pixel electrode electrically connected to the first drain electrode; an emitting layer disposed on the pixel electrode; and a common electrode disposed on the emitting layer. In an embodiment, the light blocking layer and the first semiconductor pattern are disposed on substantially a same layer.

In an embodiment, the light blocking layer includes a metallic material including chrome.

In an embodiment, the metallic material includes one of chrome oxide and chrome nitride.

In an embodiment, the first semiconductor pattern includes a polycrystalline silicon material.

In an embodiment, the organic light emitting diode display further includes a second semiconductor pattern disposed on the substrate, a second gate electrode disposed on the gate insulating layer and overlapping the second semiconductor pattern, a second source electrode electrically connected to the second semiconductor pattern, and a second drain electrode electrically connected to the first gate electrode and spaced apart from the second source electrode.

In an embodiment, the light blocking layer, the first semiconductor pattern, and the second semiconductor pattern are disposed substantially on a same layer.

In an embodiment, the organic light emitting diode display further includes a buffer layer disposed on substantially an entire surface of the substrate, wherein the first semiconductor pattern and the light blocking layer are disposed on the buffer layer.

In an embodiment, the light blocking layer is disposed with a pixel opening corresponding to the pixel electrode.

In another exemplary embodiment disclosed is a method of manufacturing an organic light emitting diode display, the method including disposing a semiconductor pattern on a substrate; disposing a light blocking layer on the substrate, the light blocking layer having a semiconductor opening which exposes the semiconductor pattern; disposing a gate insulating layer on the semiconductor pattern and the light blocking layer; disposing a gate electrode on the gate insulating layer; disposing a source electrode electrically connected to the semiconductor pattern and a drain electrode spaced apart from the source electrode; disposing a pixel electrode electrically connected to the drain electrode; disposing an emitting layer on the pixel electrode; and disposing a common electrode on the emitting layer.

In an embodiment, disposing the semiconductor pattern and the disposing of the light blocking layer further comprise disposing a semiconductor layer on the substrate, disposing a first photoresist pattern on the semiconductor layer, etching the semiconductor pattern using the first photoresist pattern as an etch mask to form the semiconductor pattern, disposing a light blocking material on the substrate and the first photoresist pattern, disposing a second photoresist pattern on the light blocking material, etching the light blocking material using the second photoresist pattern as an etch mask to form the light blocking layer; and removing the first and second photoresist patterns.

In an embodiment, the disposing of the semiconductor layer further includes crystallizing the semiconductor layer.

In an embodiment, the light blocking layer further includes a metallic material including chrome.

In an embodiment, the semiconductor pattern includes a polycrystalline silicon material.

In an embodiment, a buffer layer is disposed on substantially an entire surface of the substrate before the semiconductor pattern and the light blocking layer are disposed on the substrate.

In an embodiment, the light blocking layer of the OLED display is disposed substantially on the same layer as a semiconductor pattern after the semiconductor pattern is disposed and a semiconductor opening is disposed in the light blocking layer at a region where the semiconductor pattern is disposed. Thus, a crystallization defect, which can be caused by the light blocking layer, can be reduced or substantially prevented and a manufacturing process can be simplified.

These and other features, aspects, and advantages of the disclosed embodiments will become better understood with reference to the following description and appended claims.

BRIEF DESCRIPTION OF THE DRAWINGS

The above and other advantages of the present invention will become readily apparent by reference to the following detailed description when considered in conjunction with the accompanying drawings wherein:

FIGS. 4 to 7 are cross-sectional views showing an exemplary embodiment of a method of manufacturing the OLED display shown in FIG. 3;

Figure 1:
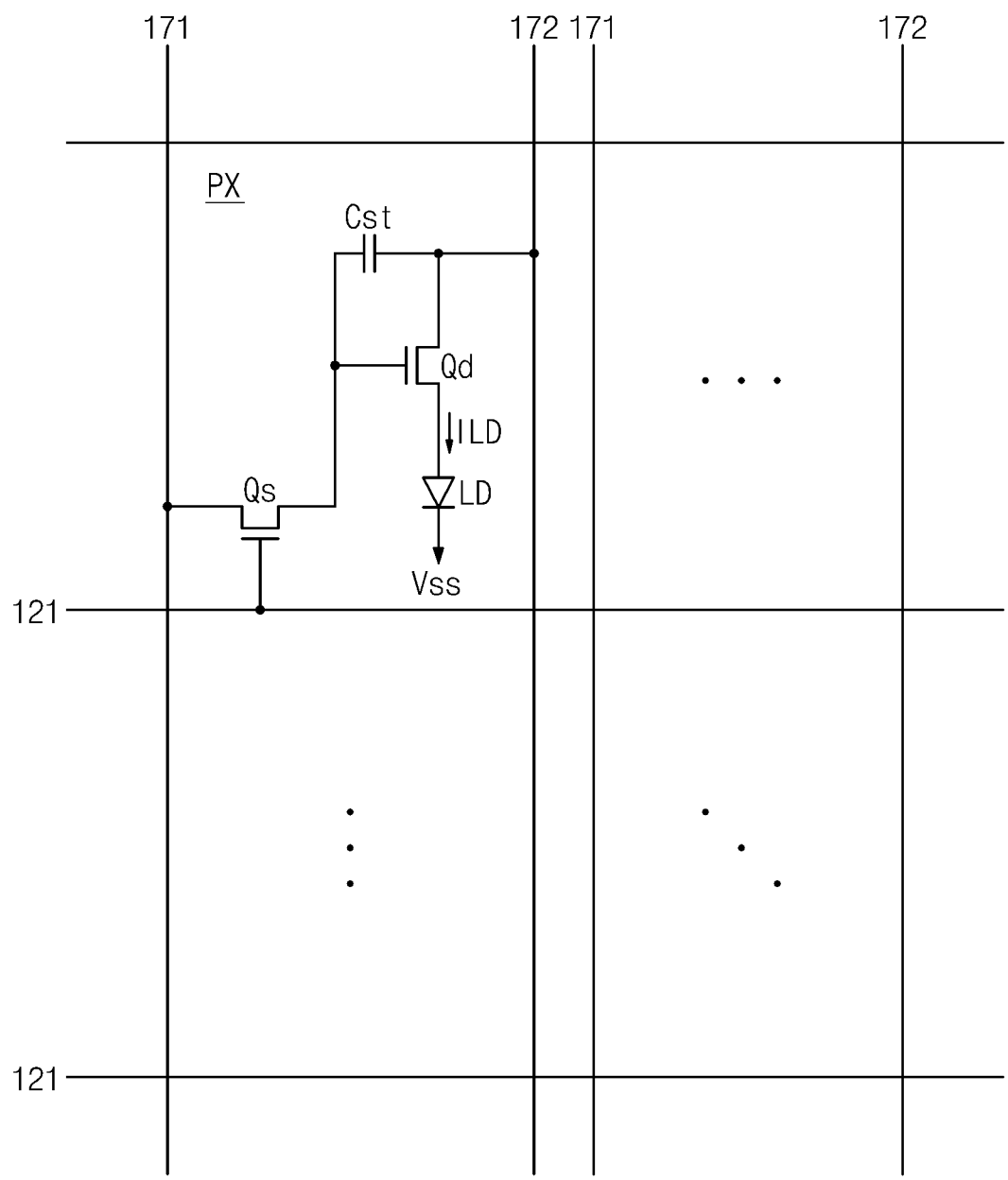
FIG. 1 is an equivalent circuit diagram of an exemplary embodiment of an Organic Light Emitting Diode ("OLED") display.

The detailed description explains the disclosed embodiments, together with advantages and features, by way of example with reference to the drawings.

DETAILED DESCRIPTION OF THE INVENTION

Hereinafter, embodiments of the present invention will be explained in detail with reference to the accompanying drawings. However, the scope of the present invention is not limited to such embodiments and the present invention may be realized in various forms. The embodiments to be described below are intended to assist those skilled in the art to completely understand the present invention. Thus aspects, advantages, and features of the present invention and methods of accomplishing the same may be understood more readily by reference to the following detailed description of preferred embodiments and the accompanying drawings. The present invention may, however, may be embodied in many different forms, and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

In the drawings, the sizes of layers and regions can be magnified for the purpose of clear explanation. Also, the same reference numerals are used to designate the same elements throughout the drawings. It will be understood that when an element, such as a layer, a film, a region, or a plate, is referred to as being 'on' or 'under' another element, the element can be directly on another element or intervening element may also be present therebetween. In addition, when an element is referred to as being "directly on" other element, intervening layers may not be present therebetween.

It will be understood that when an element or layer is referred to as being "connected to" another element or layer, the element or layer can be directly connected to another element or layer or intervening elements or layers. In contrast, when an element is referred to as being "directly connected to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present invention.

Spatially relative terms, such as "below", "lower", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings. However, the aspects, features, and advantages of the present invention are not restricted to the ones set forth herein. The above and other aspects, features and advantages of the present invention will become more apparent to one of ordinary skill in the art to which the present invention pertains by referencing a detailed description of the present invention given below.

Hereinafter, an exemplary embodiment of an OLED display will be explained in detail with reference to FIG. 1.

FIG. 1 is an equivalent circuit diagram showing an exemplary embodiment of an OLED display.

Referring to FIG. 1, the OLED display includes a plurality of signal lines, including gate lines 121, data lines 171 and driving voltage lines 172, and a plurality of pixels PX electrically connected to the signal lines and arranged in the form of a matrix.

The signal lines are divided into a plurality of gate lines 121 to transfer gate signals, a plurality of data lines 171 to transfer data signals, and a plurality of driving voltage lines 172 to transfer a driving voltage. The gate lines 121 extend in a transverse direction and are substantially parallel to each other, and the data lines 171 and the driving voltage lines 172 extend in a longitudinal direction and are substantially parallel to each other.

Each pixel PX includes a switching transistor Qs, a driving transistor Qd, a storage capacitor Cst, and an organic light emitting diode LD.

The switching transistor Qs includes a control terminal, an input terminal, and an output terminal. The control terminal is electrically connected to the corresponding gate line 121, the input terminal is electrically connected to the corresponding data line 171, and the output terminal is electrically connected to the corresponding driving transistor Qd. The switching transistor Qs transfers the data signal from the corresponding data line 171 to the driving transistor Qd in response to the gate signal supplied from the corresponding gate line 121.

The driving transistor Qd includes a control terminal, an input terminal, and an output terminal. The control terminal is electrically connected to the switching transistor Qs, the input terminal is electrically connected to the corresponding driving voltage line 172, and the output terminal is electrically connected to the organic light emitting diode LD. The driving transistor Qd can provide a path for output current ILD, which varies depending on a potential difference between the control terminal and the output terminal.

The storage capacitor Cst is electrically connected between the control terminal and the input terminal of the driving transistor Qd. The storage capacitor Cst is charged with a data signal applied to the control terminal of the driving transistor Qd and maintains the data signal even if the switching transistor Qs is turned off.

The organic light emitting diode LD includes an anode electrically connected to the output terminal of the driving transistor Qd, and a cathode electrically connected to a common voltage Vss. The organic light emitting diode LD emits light while an intensity of the light can vary according to the output current ILD of the driving transistor Qd, thereby displaying an image.

In an embodiment, the switching transistor Qs and the driving transistor Qd may each include an n-channel field effect transistor ("FET"). In addition, at least one of the switching transistor Qs and the driving transistor Qd may include a p-channel field effect transistor. A connectivity between the switching transistor Qs, the driving transistor Qd, the storage capacitor Cst, and the organic light emitting diode LD is not limited to the connectivity shown in FIG. 1.

Figure 2:
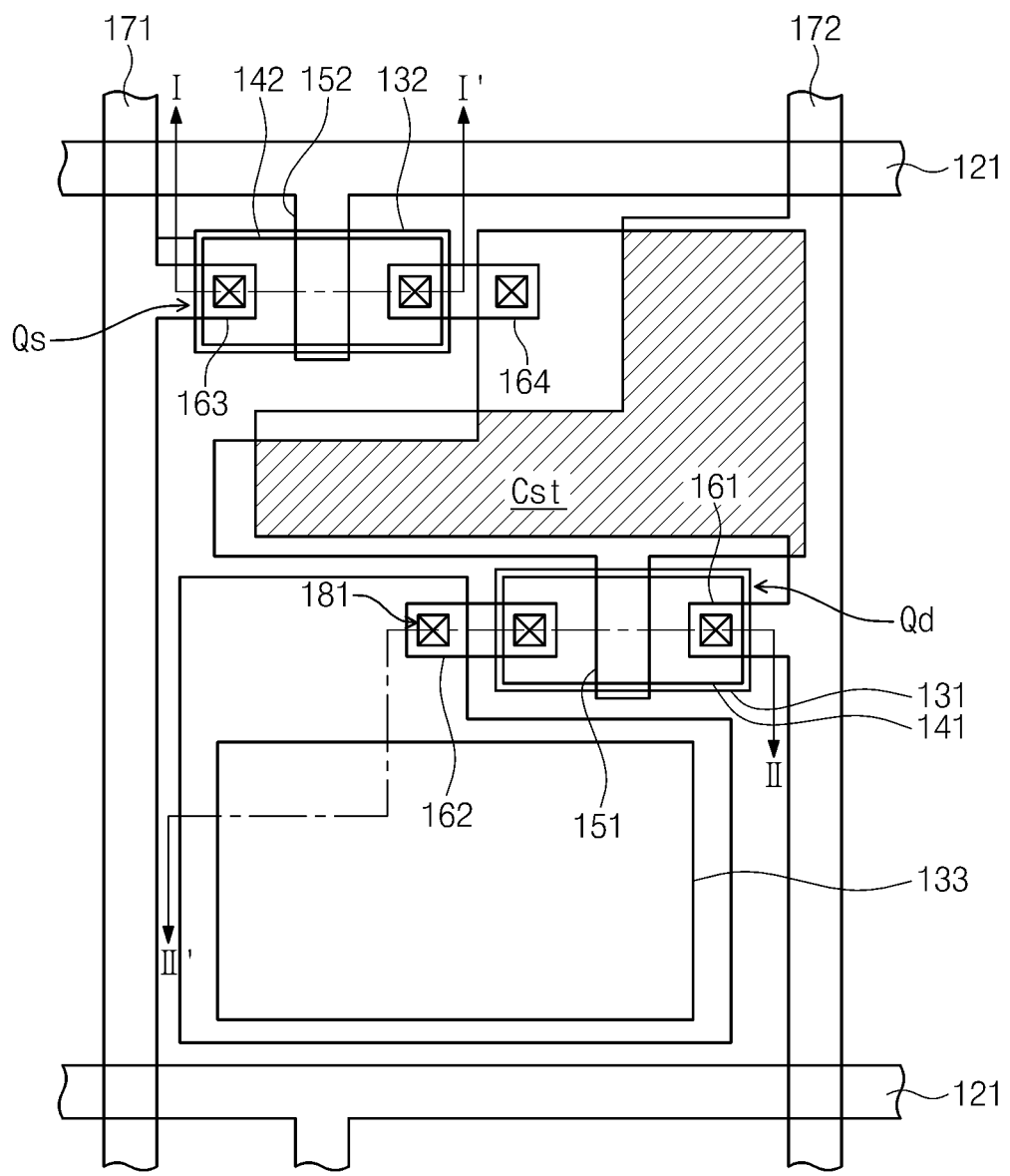
FIG. 2 is a plan view showing an exemplary embodiment of an OLED display.
Figure 3:
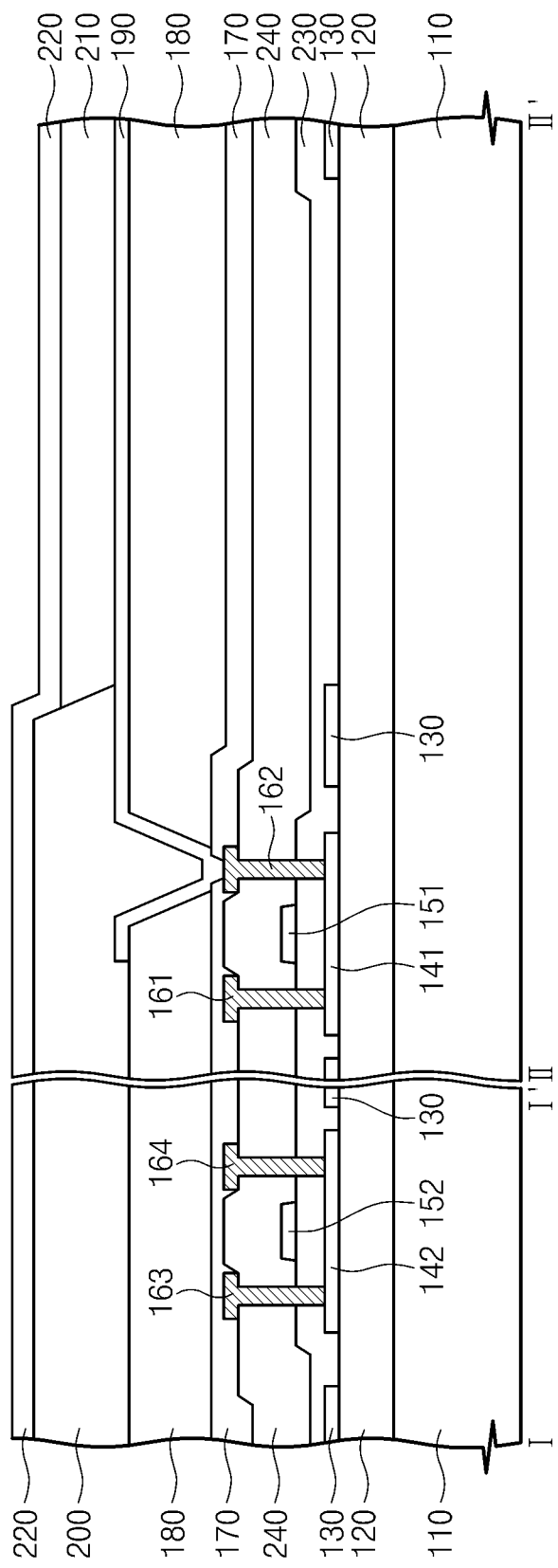
FIG. 3 is a cross-sectional view of an exemplary embodiment of an OLED display taken along lines I-I' and II-II' shown in FIG. 2.

FIG. 2 is a plan view showing an exemplary embodiment of an OLED display, and FIG. 3 is a cross-sectional view taken along lines I-I' and II-II' shown in FIG. 2.

A buffer layer 120 is disposed on an insulating substrate 110, which can include transparent glass, plastic, or the like, or a combination comprising at least one of the foregoing materials. The buffer layer 120 includes silicon oxide, or the like and is disposed over substantially an entire surface of the insulating substrate 110.

A light blocking layer 130, having first semiconductor openings 131, second semiconductor openings 132 and pixel openings 133, is disposed on the buffer layer 120. The light blocking layer 130 includes a metal, such as chrome, or the like. The light blocking layer 130 may have a single layer structure comprising chrome oxide ($CrO_x$), a dual layer structure comprising chrome oxide ($CrO_x$) and chrome nitride ($CrN_x$), or a triple layer structure comprising chrome oxide ($CrO_x$), chrome, and chrome nitride ($CrN_x$).

A first semiconductor pattern 141 of the driving transistor Qd and a second semiconductor pattern 142 of the switching transistor Qs are disposed in the first and second semiconductor openings 131 and 132 of the light blocking layer 130, respectively. The first and second semiconductor patterns 141 and 142 can be formed through a crystallization process using polycrystalline silicon. Exemplary crystallization processes include a solid phase crystallization ("SPC") process, an excimer laser annealing ("ELA") process, a metal induced crystallization ("MIC") process, a sequential lateral solidification ("SLS") process, or the like, or a combination comprising at least one of the foregoing crystallization processes.

A lower gate insulating layer 230 including silicon nitride ($SiN_x$), silicon oxide ($SiO_x$), or the like, or a combination comprising at least one of the foregoing materials, is disposed over substantially an entire surface of the buffer layer 120, including the light blocking layer 130, the first semiconductor pattern 141, and the second semiconductor pattern 142. A first gate electrode 151 of the driving transistor Qd and a second gate electrode 152 of the switching transistor Qs are disposed on the lower gate insulating layer 230. The first and second gate electrodes 151 and 152 can comprise an aluminum-based metal, such as aluminum (Al), an aluminum alloy, a silver-based metal, silver (Ag), a silver alloy, a copper-based metal, copper (Cu), a copper alloy, a molybdenum-based metal, molybdenum (Mo), a molybdenum alloy, chrome (Cr), tantalum (Ta), titanium (Ti), or the like, or a combination comprising at least one of the foregoing metals. In addition, the first and second gate electrodes 151 and 152 may have a multi-layer structure of two conductive layers (not shown) having physical properties which are different from each other. The second gate electrode 152 is electrically connected to the corresponding gate line 121.

An upper gate insulating layer 240, including silicon nitride ($SiN_x$), silicon oxide ($SiO_x$), or the like, or a combination comprising at least one of the foregoing materials, is disposed on the lower gate insulating layer 230 and includes the first and second gate electrodes 151 and 152.

The data lines 171, the driving voltage lines 172, first and second source electrodes 161 and 163, and first and second drain electrodes 162 and 164 are disposed on the gate insulting layer 240.

The data lines 171 transfer data signals and are disposed substantially perpendicular to the gate lines 121, and can extend in the transverse direction. The driving voltage lines 172 transfer driving voltage and are disposed substantially perpendicular to the gate lines 121, and can extend in the transverse direction.

The first source electrode 161 branches from the corresponding driving voltage line 172. The first and second drain electrodes 162 and 164 are electrically isolated from each other. In addition, the first and second drain electrodes 162 and 164 are electrically isolated from the data lines 171 and the driving voltage lines 172. The first source electrode 161 faces the first drain electrode 162 on the first semiconductor pattern 141, and the second source electrode 163 faces the second drain electrode 164 on the second semiconductor pattern 142.

Each of the data lines 171, the driving voltage lines 172, the first and second source electrodes 161 and 163, and the first and second drain electrodes 162 and 164 may include a low-resistance metal, such as aluminum, copper, silver, an alloy thereof, or the like, or a refractory metal, such as molybdenum, chrome, tantalum, titanium, an alloy thereof, or the like, or a combination comprising at least one of the foregoing metals, and may have a multi-layer structure including a refractory metal layer (not shown) and a low-resistance conductive layer (not shown).

A protective layer 170 is disposed on the upper gate insulating layer 240, having the data lines 171, the driving voltage lines 172, the first and second source electrodes 161 and 163, and the first and second drain electrodes 162 and 164. The protective layer 170 includes silicon oxide, silicon nitride, or the like, or a combination comprising at least one of the foregoing materials.

The protective layer 170 can protect electrodes disposed below the protective layer 170. In an embodiment, the protective layer 170 can reduce or substantially prevent the electrodes, which can include conductive materials having weak chemical-resistance, from being damaged or degraded by a chemical solution, such as an etchant, in a subsequent process.

An interlayer dielectric layer 180 is disposed on the protective layer 170. The interlayer dielectric layer 180 has a thickness sufficient to planarize a region where the switching transistor Qs and the driving transistor Qd are disposed. The interlayer dielectric layer 180 includes a material selected from the group consisting of polyimide, benzocyclobutene series resin, acrylate, methacrylate, and the like, and a combination comprising at least one of the foregoing materials.

A contact 181 is disposed in the interlayer dielectric layer 180 and the protective layer 170 to expose the second drain electrode 164. A pixel electrode 190 is formed on the interlayer dielectric layer 180. The pixel electrode 190 contacts the first drain electrode 162 through the contact 181 and overlaps the pixel openings 133. The pixel electrode 190 includes a transparent metal, such as indium tin oxide ("ITO"), or the like.

A partition wall 200 is disposed on the pixel electrode 190 and the interlayer dielectric layer 180. The partition wall 200 surrounds the pixel electrode 190, can comprise an inclined surface, and an opening is disposed in the partition wall 200 to expose the pixel electrode 190. The partition wall 200 includes an organic insulating material, which is heat-resistant and solvent-resistant, and can comprise an acrylic resin, a polyimide resin, or the like, or an inorganic insulating material, such as silicon oxide ($SiO_2$), titanium oxide ($TiO_2$), or the like, or a combination comprising at least one of the foregoing insulating materials. In addition, the partition wall 200 may have a multi-layer structure.

An organic light emitting member 210 is disposed on the pixel electrode 190 exposed through the opening disposed in the partition wall 200.

The organic light emitting member 210 may have a multi-layer structure including an emitting layer (not shown) to emit light and an auxiliary layer (not shown) to improve light emission efficiency of the emitting layer.

The organic light emitting layer includes an organic substance, or a mixture of an organic substance and an inorganic substance, and can emit light having one of three primary colors (red, green and blue). The emitting layer includes a material selected from the group consisting of a polyfluorene derivative, a (poly)paraphenylenevinylene derivative, a polyphenylene derivative, polyvinylcarbazole, a polythiophene derivative, and the like, and a combination comprising at least one of the foregoing materials, and a compound obtained by doping at least one of the above materials with a perylene-based pigment, a coumarin-based pigment, a rhodamine-based pigment, rubrene, perylene, 9,10-diphenylanthracene, tetraphenylbutadiene, Nile red, coumarine, quinacridone, or the like, or a combination comprising at least one of the foregoing compounds. The OLED display displays the desired image by spatially combining lights having primary colors emitted from the emitting layer of each pixel.

The auxiliary layer includes an electron transport layer (not shown) and a hole transport layer (not shown) for transport of electrons and holes, respectively. In addition, the auxiliary layer includes an electron injecting layer (not shown) and a hole injecting layer (not shown) to inject the electrons and holes, respectively. The auxiliary layer may include at least one layer selected from the above layers. The hole transport layer and the hole injecting layer include a material having a work function corresponding to a mean work function of the pixel electrode 190 and the emitting layer, and the electron transport layer and the electron injecting layer include a material having a work function corresponding to a mean work function of the common electrode 220 and the emitting layer. In an embodiment, the hole transport layer and the hole injecting layer may include poly-3,4-ethylenedioxythiophene:polystyrenesulfonate (PEDOT:PSS), for example.

The common electrode 220 is disposed on the organic light emitting member 210. The common electrode 220 is disposed on substantially an entire surface of the substrate and transfers electric current to the organic light emitting member 210 in cooperation with the pixel electrode 190. The common electrode 220 may include a metal having a reflectivity of at least about 50 percent (%), specifically at least about 80%, more specifically at least about 85%, and can comprise silver (Ag), palladium (Pd), platinum (Pt), or the like, or a combination comprising at least one of the foregoing metals. In an embodiment, the common electrode 220 includes silver (Ag).

In an OLED display having the above described structure, the second gate electrode 152, which is electrically connected to the corresponding gate line 121, the second source electrode 163, and the second drain electrode 164, which are electrically connected to the corresponding data line 171, and the second semiconductor pattern 142, constitute the switching transistor Qs. A channel of the switching transistor Qs is disposed on the second semiconductor pattern 142 between the second source electrode 163 and the second drain electrode 164. In addition, the first gate electrode 151, which is electrically connected to the second drain electrode 164, the first source electrode 161, which is electrically connected to the corresponding driving voltage line 172, the first drain electrode 162, which is electrically connected to the pixel electrode 190, and the first semiconductor pattern 141, constitute the driving transistor Qd. A channel of the driving transistor Qd is disposed on the first semiconductor pattern 141 between the first source electrode 161 and the first drain electrode 162.

Although one switching transistor Qs and one driving transistor Qd are included in the exemplary embodiment shown in FIG. 2, at least one thin film transistor and a plurality of interconnections to drive the transistors can be further provided. In an embodiment comprising greater than one thin film transistor, degradation of the organic light emitting diode LD and the driving transistor Qd can be reduced or substantially prevented, even if they are driven for a long period of time. Accordingly a life span of the OLED display can be increased.

An organic light emitting diode LD comprises the pixel electrode 190, the organic light emitting member 210, and the common electrode 220. In an exemplary embodiment, the pixel electrode 190 serves as an anode and the common electrode 220 serves as a cathode. In another embodiment, the pixel electrode 190 serves as a cathode and the common electrode 220 serves as an anode.

Hereinafter, a method of manufacturing the OLED display shown in FIGS. 2 and 3 is described with reference to FIGS. 4 to 13.

Figure 8:
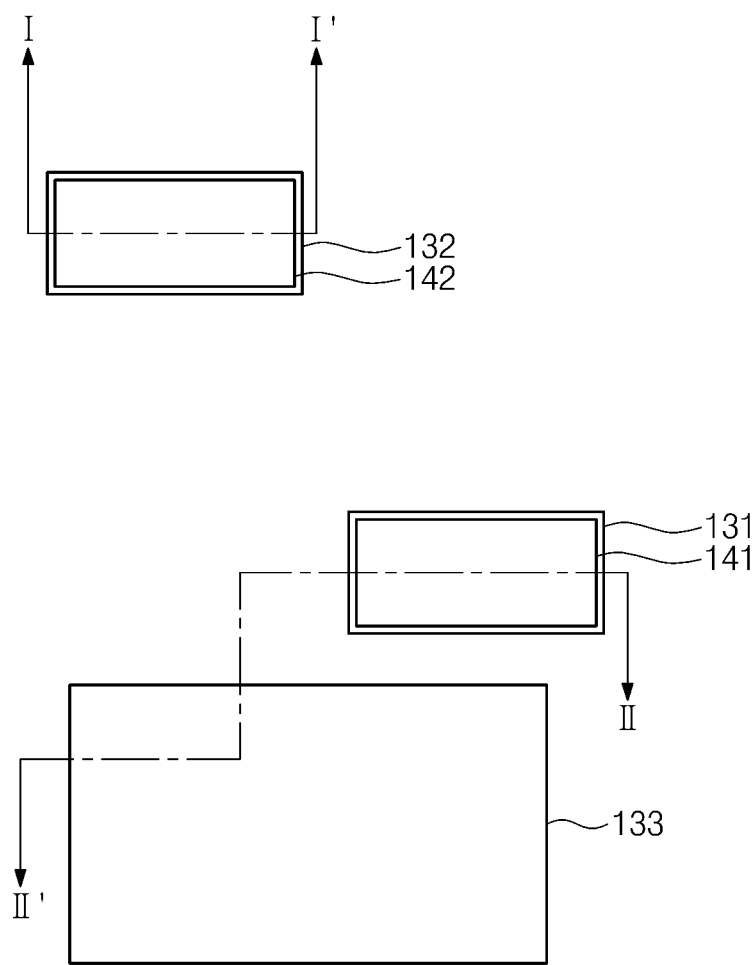
FIGS. 8, 10 and 12 are plan views showing an exemplary embodiment of a method of manufacturing the OLED display shown in FIG. 2.
Figure 9:
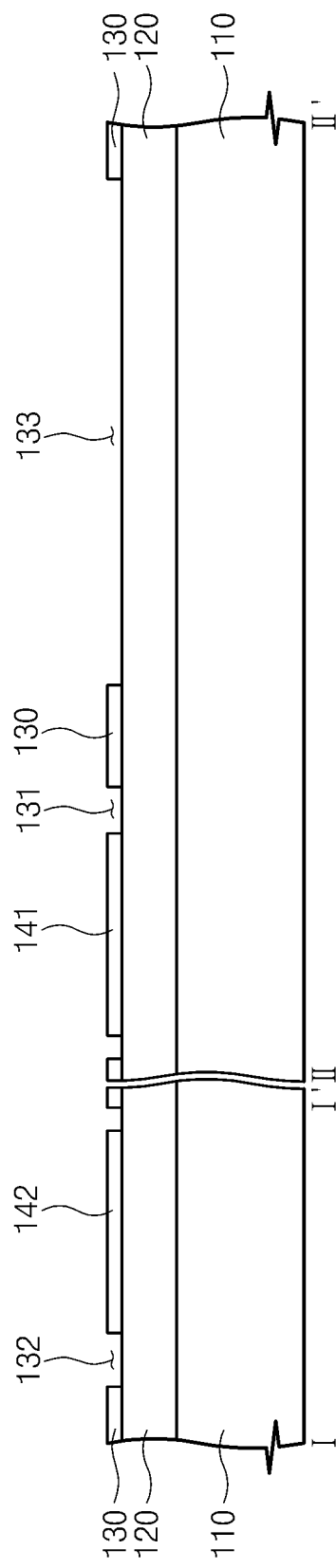
FIG. 9 is a cross-sectional view of an exemplary embodiment of an OLED display taken along lines I-I' and II-II' shown in FIG. 8.
Figure 10:
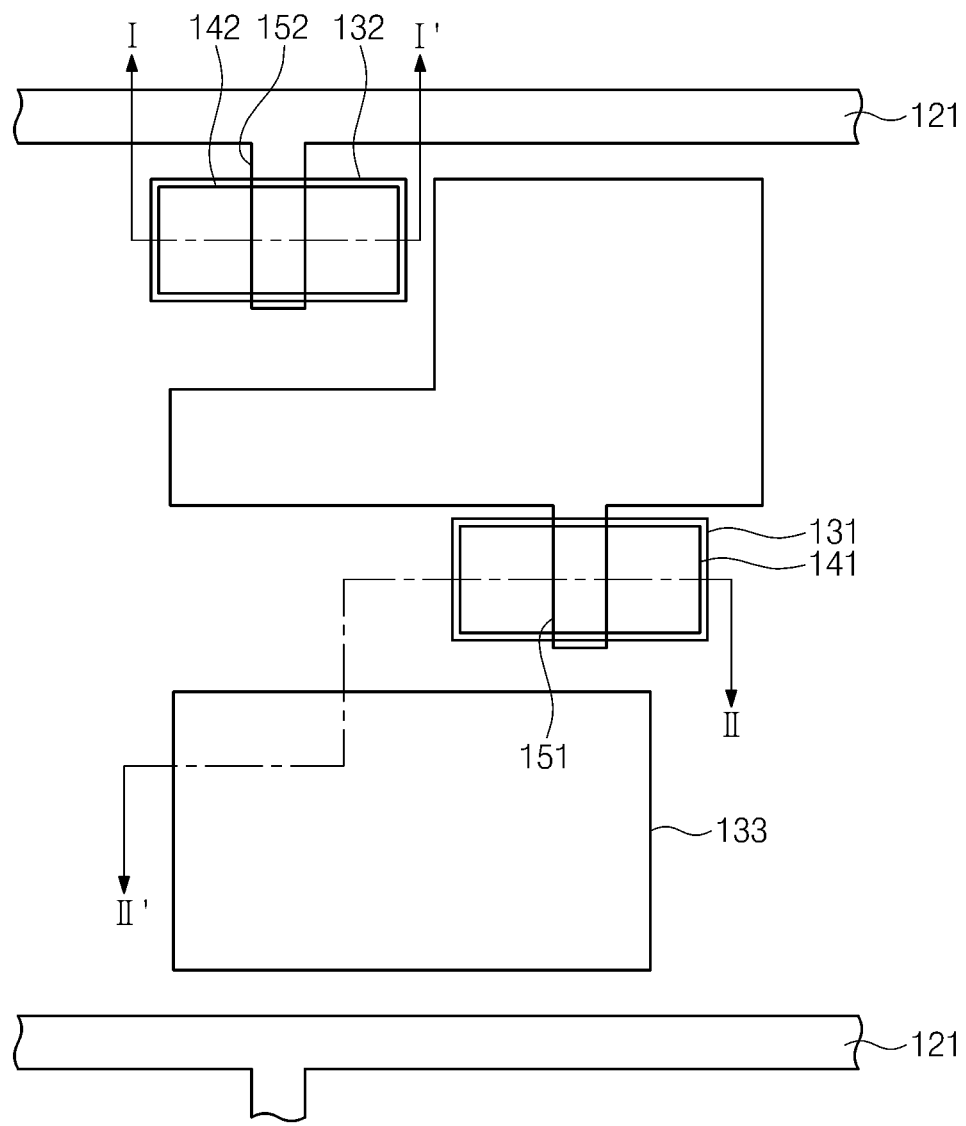
Figure 11:
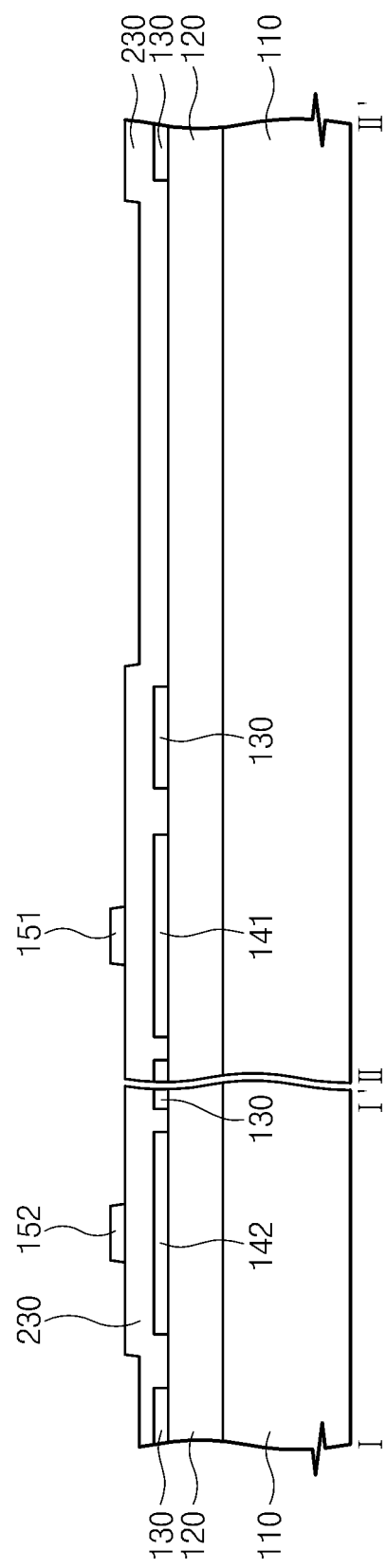
FIG. 11 is a cross-sectional view of an exemplary embodiment of an OLED display taken along lines I-I' and II-II' shown in FIG. 10.
Figure 12:
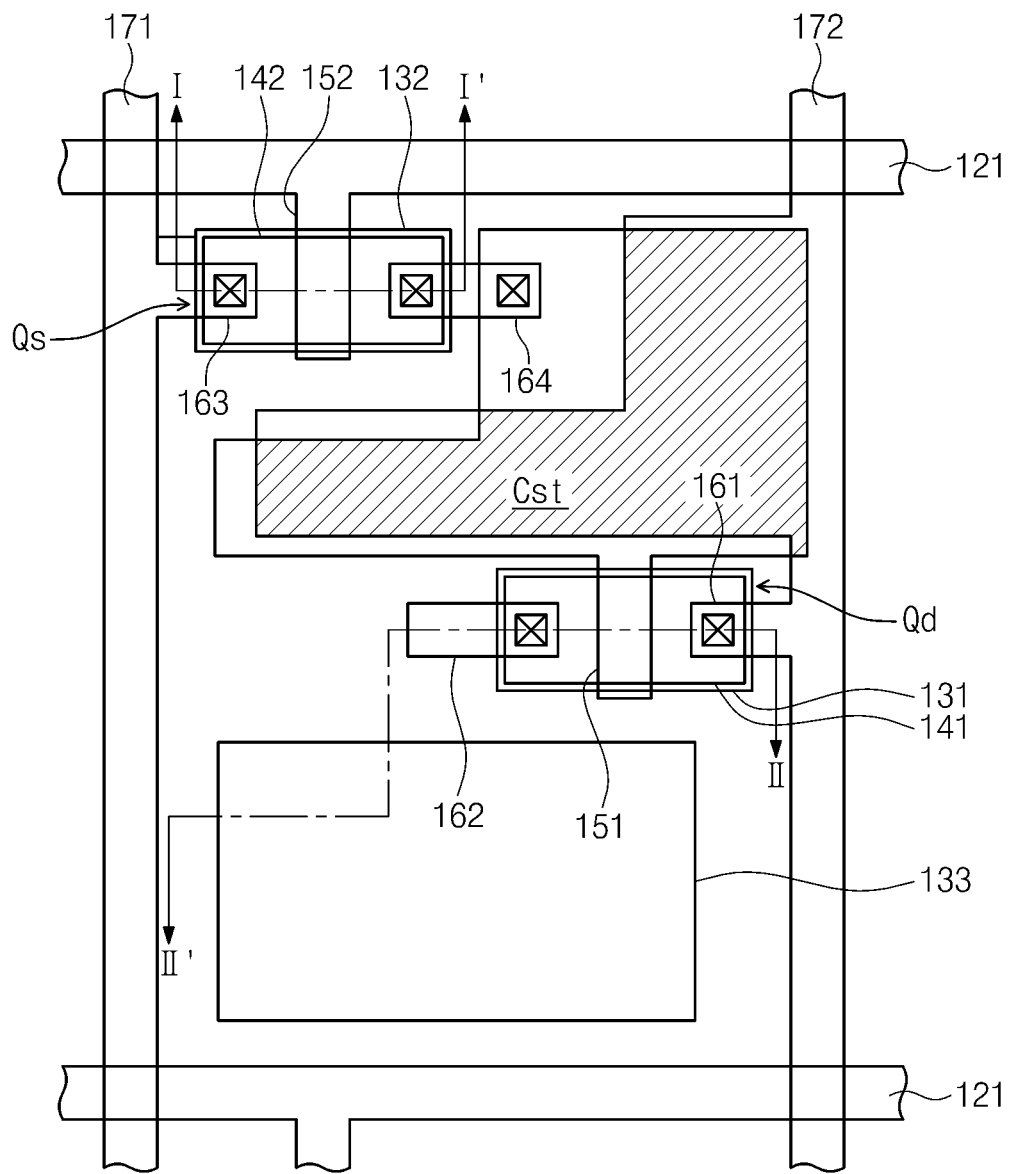
Figure 13:
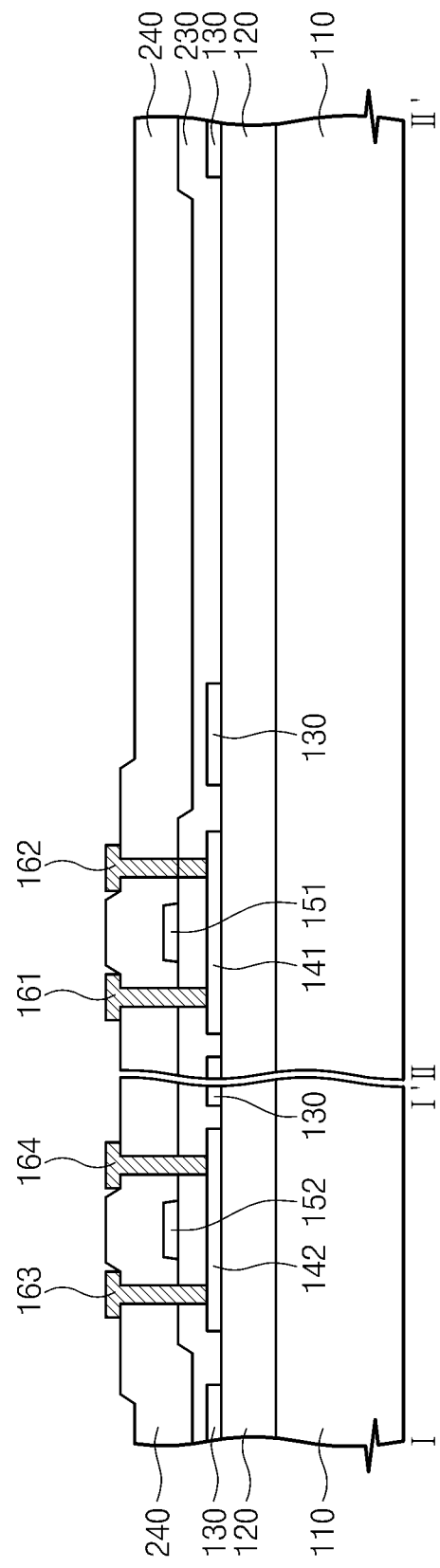
FIG. 13 is a cross-sectional view of an exemplary embodiment of an OLED display taken along lines I-I' and II-II' shown in FIG. 12.

FIGS. 8, 10 and 12 are plan views showing an exemplary embodiment of a method of manufacturing the OLED display shown in FIGS. 2 and 3, FIG. 9 is a cross-sectional view of an exemplary embodiment of an OLED display taken along lines I-I' and II-II' shown in FIG. 8, FIG. 11 is a cross-sectional view of an exemplary embodiment of an OLED display taken along lines I-I' and II-II' shown in FIG. 10, and FIG. 13 is a cross sectional view of an exemplary embodiment of an OLED display taken along lines I-I' and II-II' shown in FIG. 12.

As shown in FIG. 4, the buffer layer 120 is disposed on the insulating substrate 110 by disposing a material, such as silicon oxide, or the like, on the insulating substrate 110 through a plasma enhanced chemical vapor deposition ("PECVD") process, or the like.

Then, an amorphous silicon material is disposed on the buffer layer 120 and a semiconductor layer 140, including a crystalline silicon material, or the like, is disposed through a crystallization process, or the like.

The crystallization process can include a SPC process, an ELA process, a MIC process, a SLS process, or the like, or a combination comprising at least one of the foregoing crystallization processes.

Next, as shown in FIG. 5, a photoresist is disposed on the semiconductor layer 140, which includes a crystalline silicon material, and a photolithography process is performed to form first and second photoresist patterns 143 and 144. Then, the semiconductor layer 140, which includes a crystalline silicon material, is etched using the first and second photoresist patterns 143 and 144 as an etch mask, thereby forming the first and second semiconductor patterns 141 and 142.

As shown in FIGS. 6 and 7, a metallic material 135 including chrome, or the like, can then be disposed on the first and second photoresist patterns 143 and 144 and the buffer layer 120. After disposing a photoresist on the metallic material 135, the photolithography process is performed to form a third photoresist pattern 145. After that, the metallic material 135 is etched using the third photoresist pattern 145 as an etch mask, thereby forming the light blocking layer 130. Then, as shown in FIGS. 8 and 9, the first to third photoresist patterns 143, 144, and 145 are removed to form the first and second semiconductor patterns 141 and 142 and the light blocking layer 130 on the buffer layer 120. The light blocking layer 130 can be disposed with the first and second semiconductor openings 131 and 132 through which the first and second semiconductor patterns 141 and 142 are exposed, respectively.

As described above, the crystallization process can be performed even if a stepped portion is not disposed in the semiconductor layer 140 due to the flat structure of the buffer layer 120. Thus, a crack may not occur during the crystallization process. If the crack occurs in the crystalline material during the crystallization process, impurities may infiltrate into the crack during the subsequent etching process. In addition, since the first semiconductor pattern 141, the second semiconductor pattern 142, and the light blocking layer 130 are disposed on the same layer, the first to third photoresist patterns 143, 144 and 145 can be simultaneously removed, thereby simplifying a manufacturing process.

As shown in FIGS. 10 and 11, the lower gate insulating layer 230 is disposed by disposing silicon nitride, silicon oxide, or the like on the first and second semiconductor patterns 141 and 142 and the light blocking layer 130.

Then, the gate lines 121, the first gate electrode 151, and the second gate electrode 152, including the aluminum alloy are disposed on the lower gate insulating layer 230 using a photolithography process, or the like.

Subsequently, as shown in FIGS. 12 and 13, silicon nitride, silicon oxide, or the like, or a combination comprising at least one of the foregoing materials, are disposed on the gate lines 121, the first gate electrode 151, and the second gate electrode 152, and the photolithography process is performed to form the upper gate insulating layer 240 having a plurality of openings.

Then, the data lines 171, the driving voltage lines 172, the first source electrode 161, the first drain electrode 162, the second source electrode 163, and the second drain electrode 164, which can include an aluminum alloy, are disposed on the upper gate insulating layer 240. The first source electrode 161 and the first drain electrode 162 are electrically connected to the first semiconductor pattern 141, and the second source electrode 163 and the second drain electrode 164 are electrically connected to the second semiconductor pattern 142 through the openings disposed in the upper gate insulating layer 240.

After that, as shown in FIGS. 2 and 3, the protective member 170 having a plurality of contacts is disposed on the data lines 171, the driving voltage lines 172, the first source electrode 161, the first drain electrode 162, the second source electrode 163, and the second drain electrode 164 using the photolithography process, or the like.

Then, the interlayer dielectric layer 180 having a plurality of contacts is disposed on the protective member 170.

Subsequently, the ITO layer is disposed on the interlayer dielectric layer 180 and then the photolithography process is performed to form the pixel electrode 190.

After that, an organic photoresist layer is disposed on the pixel electrode 190 and the interlayer dielectric layer 180, and then an exposure and development process is performed to form the partition wall 200 having a plurality of openings.

Then, the organic light emitting member 210 having the hole transport layer and the emitting layer is disposed in the opening of the partition wall 200. The organic light emitting member 210 can be formed using a solution process, such as an inkjet printing process, or a deposition process. If the inkjet printing process is used to form the organic light emitting member 210, in which a solution is disposed on the opening by a movable inkjet head (not shown), a drying process can be desirable after each layer has been disposed.

After that, the common electrode 220 is disposed on the partition wall 200 and the organic light emitting member 210. The common electrode 220 may include a metal having a reflectivity of at least about 60%, specifically at least about 80%, more specifically at least about 85%, such as silver (Ag), palladium (Pd), platinum (Pt), or the like, or a combination comprising at least one of the foregoing metals. In an embodiment, the common electrode 220 includes silver (Ag).

As described above, the OLED display has a bottom-emission structure, in which the organic light emitting member 210 emits light downward through the pixel electrode 190, so that a pixel opening 133 corresponding to the pixel electrode 190 can be disposed in the light blocking layer 130.

In an embodiment, the OLED display may have a top-emission structure, in which the positions of the common electrode 220 and the pixel electrode 190 are interchanged and the organic light emitting member 210 emits light upward through the pixel electrode 190. In an embodiment, the pixel opening 133 is not disposed in the light blocking layer 130.

Although the exemplary embodiments have been described, it is understood that the present invention should not be limited to these exemplary embodiments but various changes and modifications can be made by one ordinary skilled in the art within the spirit and scope of the present invention as hereinafter claimed.

What is claimed is:

1. An organic light emitting diode display comprising:
   a substrate;
   a light blocking layer disposed on the substrate, wherein the light blocking layer has at least one semiconductor opening;
   a first semiconductor pattern disposed in the semiconductor opening, wherein the light blocking layer and the first semiconductor pattern are positioned on a same layer;
   a gate insulating layer disposed directly on the light blocking layer and the first semiconductor pattern, the light blocking layer and the first semiconductor pattern intermediate the substrate and the gate insulating layer;
   a first gate electrode disposed on the gate insulating layer;
   a first source electrode electrically connected to the first semiconductor pattern;
   a first drain electrode spaced apart from the first source electrode;
   a pixel electrode electrically connected to the first drain electrode;
   an emitting layer disposed on the pixel electrode; and
   a common electrode disposed on the emitting layer.

2. The organic light emitting diode display of claim 1, wherein the light blocking layer comprise a metallic material comprising chrome.

3. The organic light emitting diode display of claim 2, wherein the metallic material further comprises at least one of chrome oxide and chrome nitride.

4. The organic light emitting diode display of claim 1, wherein the first semiconductor pattern comprises a polycrystalline silicon material.

5. The organic light emitting diode display of claim 1, further comprising a protective insulating layer disposed on the first source electrode and the first drain electrode and having a contact portion.

6. The organic light emitting diode display of claim 5, wherein the pixel electrode is electrically connected to the first drain electrode through the contact portion.

7. The organic light emitting diode display of claim 1, further comprising:
   a second semiconductor pattern disposed on the substrate;
   a second gate electrode disposed on the gate insulating layer and overlapping the second semiconductor pattern;
   a second source electrode electrically connected to the second semiconductor pattern; and
   a second drain electrode electrically connected to the first gate electrode and spaced apart from the second source electrode.

8. The organic light emitting diode display of claim 7, wherein the light blocking layer, the first semiconductor pattern, and the second semiconductor pattern are disposed on substantially a same layer.

9. The organic light emitting diode display of claim 1, further comprising a buffer layer disposed between the substrate and the first semiconductor pattern.

10. The organic light emitting diode display of claim 1, wherein the light blocking layer is disposed with a pixel opening corresponding to the pixel electrode.

11. The organic light emitting diode display of claim 1, wherein the light blocking layer, the first semiconductor pattern and the gate insulating layer are intermediate the substrate and the first source and first drain electrodes.

12. The organic light emitting diode display of claim 1, wherein first source and first drain electrodes are disposed above the first gate electrode, and the first gate electrode is disposed above the gate insulating layer.

13. The organic light emitting diode display of claim 1, wherein the first gate electrode is disposed directly on the gate insulating layer.

* * * * *